United States Patent
Chen et al.

(10) Patent No.: US 8,550,576 B2
(45) Date of Patent: Oct. 8, 2013

(54) CHASSIS MODULE FOR FIXING ELECTRONIC DEVICES

(75) Inventors: Chuan-Feng Chen, Taipei (TW); Chin-Pang Hsu, Tucheng (TW); Chin-Yueh Liu, Banqiao (TW)

(73) Assignees: Lite-On Electronics (Guangzhou) Limited, Guangzhou (CN); Lite-On Technology Corporation, Taipei (TW)

( * ) Notice: Subject to any disclaimer, the term of this patent is extended or adjusted under 35 U.S.C. 154(b) by 430 days.

(21) Appl. No.: 12/942,453

(22) Filed: Nov. 9, 2010

(65) Prior Publication Data

US 2012/0056515 A1 Mar. 8, 2012

(30) Foreign Application Priority Data

Sep. 6, 2010 (TW) .............................. 99217255 U

(51) Int. Cl.
*G06F 1/16* (2006.01)
(52) U.S. Cl.
USPC .......................... 312/223.2; 312/308; 312/327
(58) Field of Classification Search
USPC ................... 312/223.2, 223.1, 308, 326, 327; 361/679.32, 679.33, 679.37, 679.4, 729
See application file for complete search history.

(56) References Cited

U.S. PATENT DOCUMENTS

| | | | | |
|---|---|---|---|---|
| 5,136,466 A * | 8/1992 | Remise et al. | ........... | 361/679.37 |
| 6,700,776 B2 * | 3/2004 | Bang et al. | ............... | 361/679.58 |
| 6,999,307 B2 * | 2/2006 | Peng | ......................... | 361/679.37 |
| 7,092,249 B2 * | 8/2006 | Wang | ........................ | 361/679.33 |
| 7,257,827 B2 * | 8/2007 | Lee | ............................... | 720/653 |
| 7,440,273 B2 * | 10/2008 | Chen et al. | ............... | 361/679.33 |
| 7,639,488 B2 * | 12/2009 | Tu | ............................. | 361/679.33 |
| 7,643,280 B2 * | 1/2010 | Chen | ........................ | 361/679.33 |
| 2003/0112596 A1 * | 6/2003 | Shih | .............................. | 361/685 |
| 2004/0047122 A1 * | 3/2004 | Chen et al. | ..................... | 361/685 |
| 2004/0257760 A1 * | 12/2004 | Record et al. | ................. | 361/685 |
| 2005/0052841 A1 * | 3/2005 | Chen et al. | ..................... | 361/685 |
| 2005/0068720 A1 * | 3/2005 | Lambert et al. | ............... | 361/685 |
| 2005/0105266 A1 * | 5/2005 | Wang | ............................ | 361/685 |
| 2005/0117287 A1 * | 6/2005 | Hsu et al. | ....................... | 361/685 |
| 2006/0290246 A1 * | 12/2006 | Chen et al. | .................. | 312/223.2 |
| 2007/0002532 A1 * | 1/2007 | Chen et al. | ..................... | 361/685 |
| 2007/0133162 A1 * | 6/2007 | Hsieh | ............................ | 361/683 |
| 2007/0153467 A1 * | 7/2007 | Chen et al. | ..................... | 361/685 |
| 2007/0153469 A1 * | 7/2007 | Chen et al. | ..................... | 361/685 |
| 2008/0137281 A1 * | 6/2008 | Chen et al. | ..................... | 361/685 |
| 2008/0158809 A1 * | 7/2008 | Chen et al. | ..................... | 361/685 |
| 2012/0217856 A1 * | 8/2012 | Chen et al. | ..................... | 312/327 |
| 2012/0314361 A1 * | 12/2012 | Chen et al. | ............... | 361/679.32 |
| 2012/0326581 A1 * | 12/2012 | Liu et al. | .................... | 312/223.2 |

* cited by examiner

*Primary Examiner* — Darnell Jayne
*Assistant Examiner* — Daniel Rohrhoff
(74) *Attorney, Agent, or Firm* — Li & Cai Intellectual Property (USA) Office

(57) ABSTRACT

A chassis module for fixing electronic devices includes a fixing chassis unit, a first movable chassis unit and a second movable chassis unit. The fixing chassis unit has a fixing chassis body. The first movable chassis unit is detachably disposed in the fixing chassis body and has a first movable chassis body. One lateral wall of the first movable chassis body and one lateral wall of the fixing chassis body are retainedly mated with each other. The second movable chassis unit is detachably disposed in the fixing chassis body and has a second movable chassis body. One lateral wall of the second movable chassis body and another later wall of the first movable chassis body are retainedly mated with each other, and another lateral wall of the second movable chassis body and another lateral wall of the fixing chassis body are retainedly mated with each other.

9 Claims, 11 Drawing Sheets

CHASSIS MODULE FOR FIXING ELECTRONIC DEVICES

BACKGROUND OF THE INVENTION

1. Field of the Invention

The instant disclosure relates to a chassis module, and more particularly, to a chassis module for fixing electronic devices.

2. Description of Related Art

An electronic apparatus, such as a computer, or a server, usually includes data storage devices, such as hard disk drives, compact disk read-only memory (CD-ROM) drives, digital video disc (DVD) drives, and floppy disk drives. These devices are typically added to increase the functionality of the electronic apparatus. However, installation of such devices in the electronic apparatus is usually labor-intensive.

The installation of a hard disk drive in a computer typically requires screws to attach the hard disk drive to a bracket on a chassis of the computer. Usually, these screws are so small that it is difficult to install them. Guiding and mounting the screws into the intended location is not easy and may be time consuming. Additionally, because of their small size, the screws tend to drop before they are aligned at the intended location. This may cause damages to the circuitry of the computer.

To address the aforementioned problems, a plurality of mounting apparatuses has been invented to reduce the number of needed screws. For example, a pair of detachable rails is attached to opposite sides of a data storage device with screws. The data storage device is slid into, and secured to, a drive bracket. However, the screws have to be removed to detach the rails from the data storage device when replacing the data storage device.

In addition, the bracket of the prior art is a complete and inseparable iron frame for receiving the data storage devices such as optical disk drive and hard disk drive. However, because the bracket of the prior art is complete and inseparable and always has a large size, the cost is increased and it is inconvenient for the user to detach the bracket from the chassis.

SUMMARY OF THE INVENTION

One particular aspect of the instant disclosure is to provide a chassis module for fixing electronic devices in order to solve the above-mentioned prior problems of using the complete, inseparable and large-size bracket that is selectively assembled in the chassis.

To achieve the above-mentioned advantages, the instant disclosure provides a chassis module for fixing electronic devices, including: a fixing chassis unit, a first movable chassis unit and a second movable chassis unit. The fixing chassis unit has a fixing chassis body, a first fixing retaining structure disposed on a first lateral wall of the fixing chassis body, and a second fixing retaining structure disposed on a second lateral wall of the fixing chassis body. The first movable chassis unit is detachably disposed in the fixing chassis body. The first movable chassis unit has at least one first movable chassis body, a first movable retaining structure disposed on a first lateral wall of the at least one first movable chassis body and mated with the first fixing retaining structure, and a first crossing structure disposed on a second lateral wall of the at least one first movable chassis body, and the first crossing structure has at least one hooking hole and at least one inserting hole. The second movable chassis unit is detachably disposed in the fixing chassis body. The second movable chassis unit has at least one second movable chassis body, a second movable retaining structure disposed on a first lateral wall of the at least one second movable chassis body and mated with the second fixing retaining structure, and a second crossing structure disposed on a second lateral wall of the at least one second movable chassis body and mated with the first crossing structure. The second crossing structure has at least one hooking element and at least one inserting element, the size of the at least one hooking element corresponds to the size of the at least one hooking hole, and one part of the size of the at least one inserting element corresponds to the size of the at least one inserting hole.

Therefore, one lateral wall of the first movable chassis body and one lateral wall of the second movable chassis body are respectively retainedly mated with the two opposite lateral walls of the fixing chassis body, and another lateral wall of the first movable chassis body and another lateral wall of the second movable chassis body are crossly and retainedly mated with each other. Hence, the first movable chassis unit and the second movable chassis unit can be assembled in or detached from the fixing chassis unit easily according to the above-mentioned simple structure design. In addition, the first movable chassis unit and the second movable chassis unit not only can be assembled in the fixing chassis unit easily, but also can be detached from the fixing chassis unit easily.

To further understand the techniques, means and effects the instant disclosure takes for achieving the prescribed objectives, the following detailed descriptions and appended drawings are hereby referred, such that, through which, the purposes, features and aspects of the instant disclosure can be thoroughly and concretely appreciated. However, the appended drawings are provided solely for reference and illustration, without any intention that they be used for limiting the instant disclosure.

DETAILED DESCRIPTION OF THE PREFERRED EMBODIMENTS

Referring to FIGS. 1A to 5C, the instant disclosure provides a chassis module for fixing electronic devices, including: a fixing chassis unit 1, a first movable chassis unit 2 and a second movable chassis unit 3. For example, the fixing chassis unit 1 and the first movable chassis unit 2 can be made of metal material such as iron, and the second movable chassis unit 3 can be made of plastic material to reduce cost.

Figure 1A:
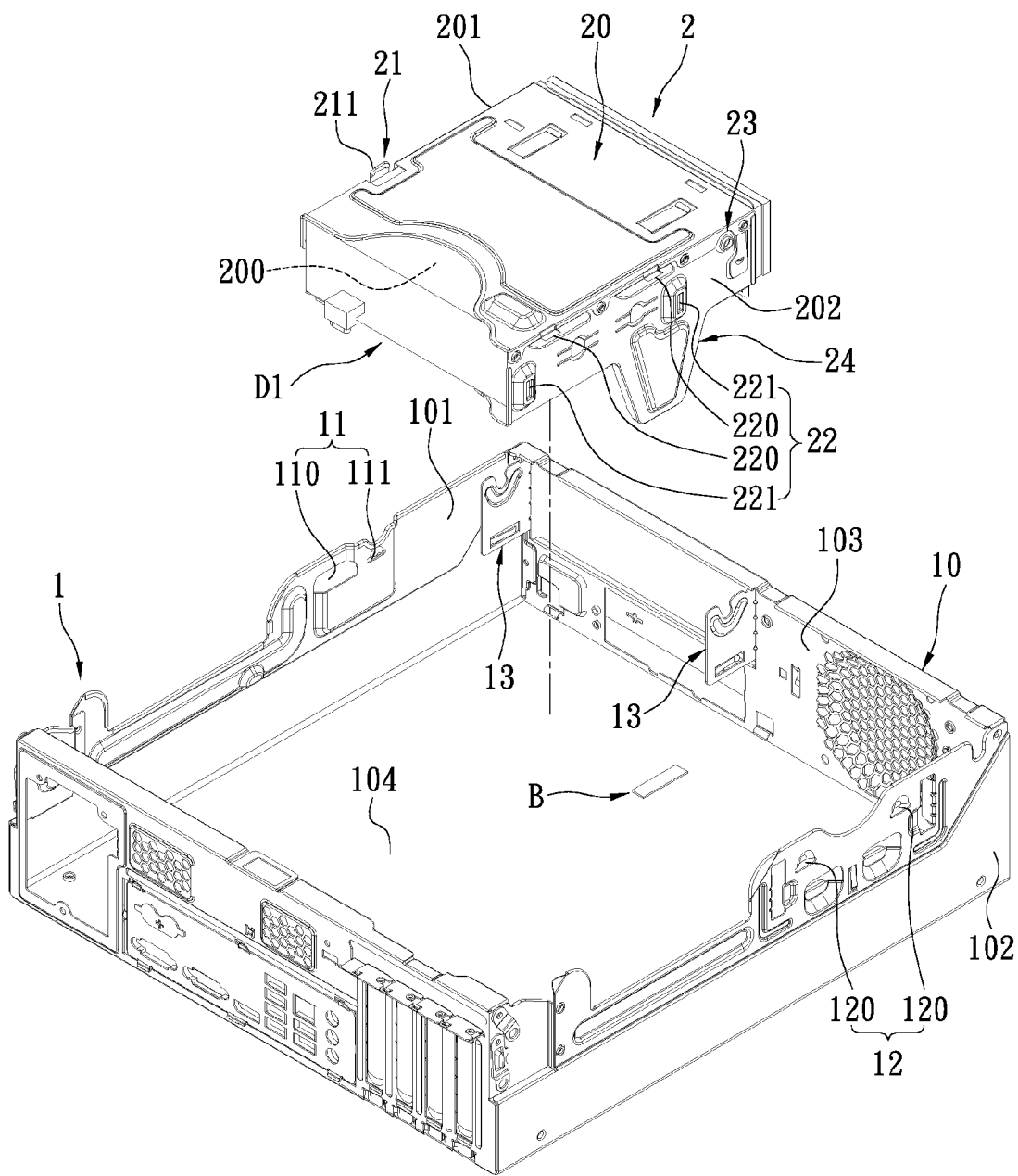
FIG. 1A shows one perspective, exploded, schematic view of the chassis module (before assembling the first movable chassis unit in the fixing chassis unit) according to the instant disclosure.
Figure 1B:
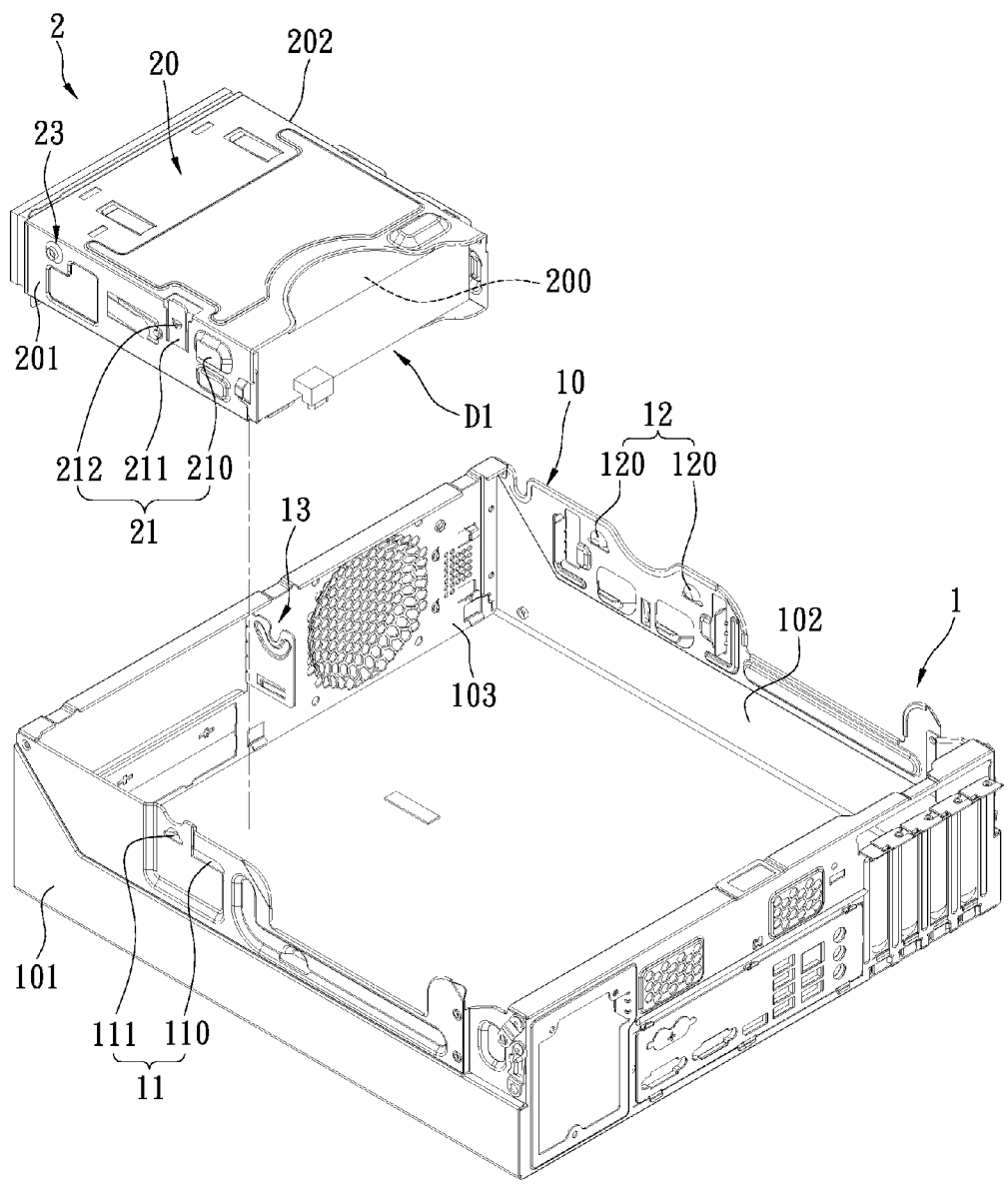
FIG. 1B shows another perspective, exploded, schematic view of the chassis module (before assembling the first movable chassis unit in the fixing chassis unit) according to the instant disclosure.

Referring to FIGS. 1A and 1B, the fixing chassis unit 1 has a fixing chassis body 10, a first fixing retaining structure 11 disposed on a first lateral wall 101 of the fixing chassis body 10, and a second fixing retaining structure 12 disposed on a second lateral wall 102 of the fixing chassis body 10. In addition, the fixing chassis body 10 may be a computer casing for receiving and fixing data storage devices (such as optical disk drive, hard disk drive etc.) or a machine caning for any purpose.

For example, the fixing chassis unit 1 has at least two first pivot portions 13 inwardly bent and extended from a third lateral wall 103 of the fixing chassis body 10, it means the two first pivot portions 13 can be integrated with and extended from the third lateral wall 103 of the fixing chassis body 10. In addition, the first lateral wall 101 and the second lateral wall 102 are respectively disposed on two opposite lateral sides of the fixing chassis body 10, and the third lateral wall 103 is connected between one end of the first lateral wall 101 and one end of the second lateral wall 102 of the fixing chassis body 10. Moreover, the fixing chassis body 10 has an inner surface 104 simultaneously connected to the first lateral wall 101, the second lateral wall 102 and the third lateral wall 103, and the third lateral wall 103 is connected between the first lateral wall 101 and the second lateral wall 102. However, the above-mentioned definitions for the first fixing retaining structure 11, the second fixing retaining structure 12 and the first pivot portion 13 are just examples and do not limit the instant disclosure. For example, the first pivot portion 13 can be replaced by other types of retaining structure.

Referring to FIGS. 1A and 1B, the first movable chassis unit 2 has at least one first movable chassis body 20, a first movable retaining structure 21 disposed on a first lateral wall 201 of the first movable chassis body 20 and mated with the first fixing retaining structure 11, and a first crossing structure 22 disposed on a second lateral wall 202 of the first movable chassis body 20. The first lateral wall 201 and the second lateral wall 202 are respectively disposed on two opposite lateral sides of the first movable chassis body 20, and the first movable chassis body 20 has a first receiving portion 200 formed therein for receiving a first electronic device such as an optical disk drive D1.

For example, the first movable chassis unit 2 has at least two second pivot portions 23 respectively formed on two opposite lateral walls (such as the first lateral wall 201 and the second lateral wall 202) of the first movable chassis body 20 and respectively mated with the two first pivot portions 13. In addition, each first pivot portion 13 has a pivot groove or a pivot post, and each second pivot portion 23 has a pivot post received in the pivot groove of each first pivot portion 13 or a pivot groove for receiving the pivot post of each first pivot portion 13. In the instant disclosure, each first pivot portion 13 has a pivot groove and each second pivot portion 23 has a pivot post received in the pivot groove of each first pivot portion 13. However, the above-mentioned definitions for the first movable retaining structure 21, the first crossing structure 22 and the second pivot portion 23 are just examples and do not limit the instant disclosure. For example, the second pivot portion 23 can be replaced by other types of retaining structure.

Figure 2:
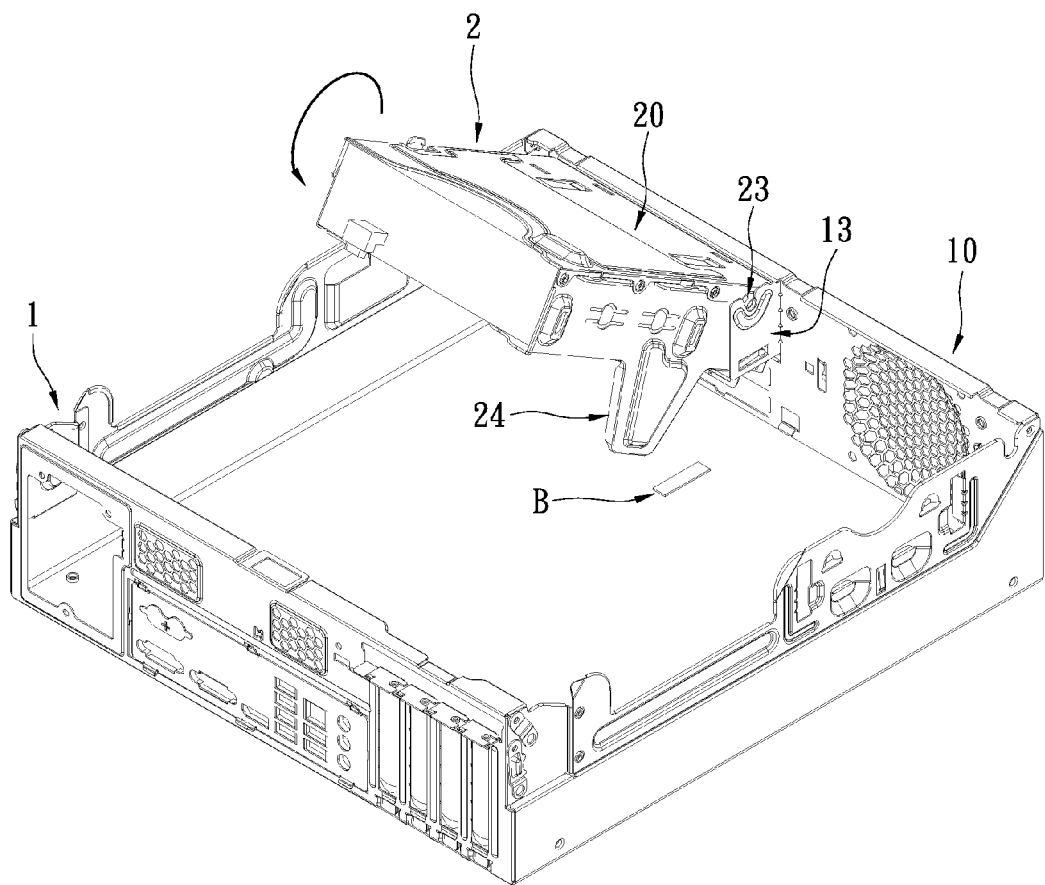
FIG. 2 shows a perspective, exploded, schematic view of the chassis module (after assembling one part of the first movable chassis unit in the fixing chassis unit) according to the instant disclosure.

Therefore, referring to FIGS. 1A, 1B, 2, 3A and 3B, the fixing chassis unit 1 and the first movable chassis unit 2 can be movably connected to each other by matching the two first pivot portions 13 and the second pivot portions 23 (as shown in FIG. 2, of course, the two first pivot portions 13 and the second pivot portions 23 can be replaced by retaining structures). Because the fixing chassis unit 1 and the first movable chassis unit 2 can be movably connected to each other, thus the fixing chassis unit 1 can be rotated relative to the two first pivot portions 13 (shown as the arrow in FIG. 2). For example, each first pivot portion 13 may be an arc-shaped opening and each second pivot portion 23 may be a cylinder, thus each second pivot portion 23 can freely contact each first pivot portion 13 and does not be locked or limited by the each first pivot portion 13. Because the two pivot portions 13 can be used as an axle center, the fixing chassis unit 1 can be rotated freely in a predetermined limit region that is defined by the position of the third lateral wall 103 and the position of the first fixing retaining structure 11.

Figure 3A:
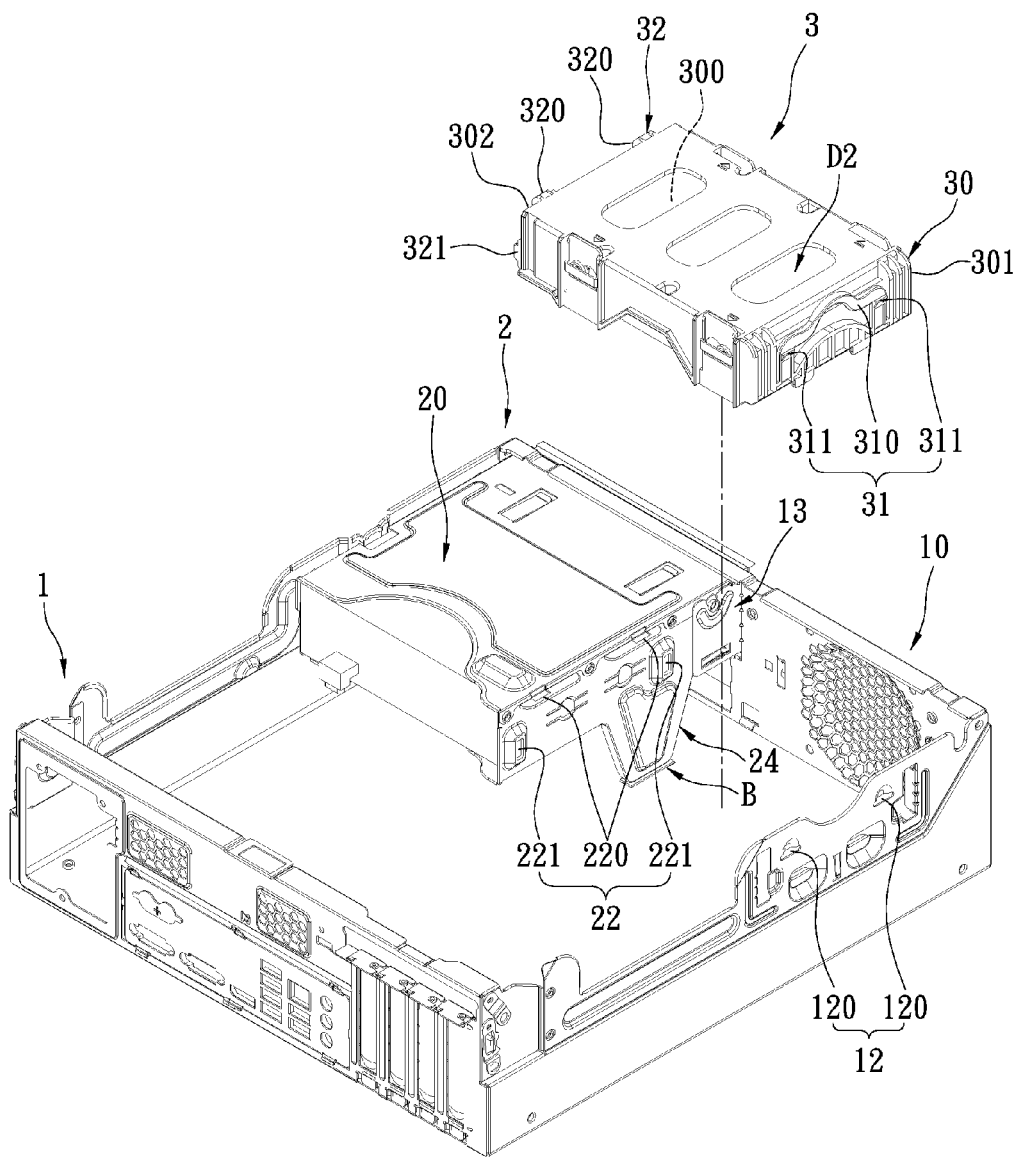
FIG. 3A shows one perspective, exploded, schematic view of the chassis module (after assembling the first movable chassis unit in the fixing chassis unit and before assembling the second movable chassis unit in the fixing chassis unit) according to the instant disclosure.
Figure 3B:
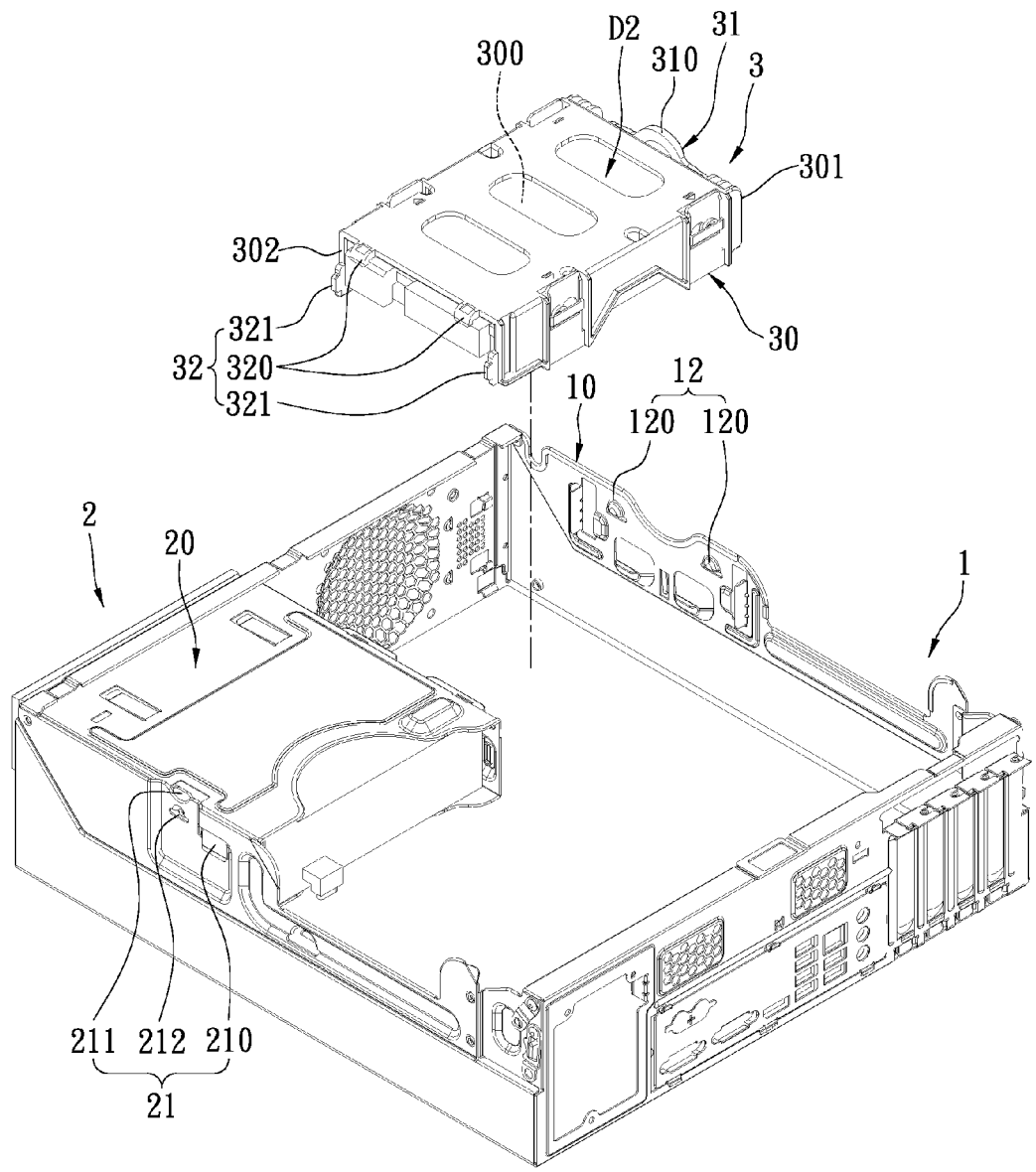
FIG. 3B shows another perspective, exploded, schematic view of the chassis module (after assembling the first movable chassis unit in the fixing chassis unit and before assembling the second movable chassis unit in the fixing chassis unit) according to the instant disclosure.

When the first movable chassis unit 2 is rotated from a position close to the third lateral wall 103 toward the first fixing retaining structure 11 and is rotated to the end (as shown in FIGS. 3A and 3B), the first movable retaining structure 21 and the first fixing retaining structure 11 are mated with each other. At this time, the first movable chassis unit 2 is approximately parallel to the inner surface 104 of the fixing chassis unit 1, the first crossing structure 22 of the first movable chassis unit 2 is approximately parallel to the first fixing retaining structure 11, and the first crossing structure 22 is also approximately parallel to the second fixing retaining structure 12 that is disposed on the second lateral wall 102 of the fixing chassis body 10.

For example, the first fixing retaining structure 11 has at least one positioning hole 110 and at least one first protrusion portion 111 (as shown in FIGS. 1A and 1B, and the first protrusion portion 111 can also be a retaining hole with any shape). The first movable retaining structure 21 has at least one positioning element 210 inserted into the positioning hole 110, at least one first elastic piece 211 selectively moved to close to or far from the first protrusion portion 111, and at least one first retaining element 212 disposed on the first elastic piece 211 and selectively inserted into or separated from the first protrusion portion 111.

Therefore, when the first movable chassis unit 2 is rotated and rotated to the end relative to the two first pivot portions 13 (as shown in FIGS. 3A and 3B), the positioning element 210 can be smoothly inserted into the positioning hole 110 for positioning the position of the first movable chassis body 20 relative to the fixing chassis body 10. At the same time, the first elastic piece 211 is pushed to close to the first protrusion portion 111 by its stored elastic force, thus the first retaining element 212 can be smoothly inserted into the first protrusion portion 111 for positioning the first movably chassis body 20 in the fixing chassis body 10.

When the user wants to take the first movable chassis body 20 out from the fixing chassis body 10, the user can lightly touch (pushing action) a top portion of the first elastic piece 211 toward the first movable chassis body 20 for separating the first retaining element 212 from the first protrusion portion 111, thus it is easy for the user to take the first movable chassis body 20 out from the fixing chassis body 10 by lightly touching the first elastic piece 211. Hence, the first movable chassis unit 2 can be detachably disposed in the fixing chassis body 10 according to different requirements. In other words, the user can assemble the first movable chassis unit 2 in the fixing chassis body 10 or detach the first movable chassis unit 2 from the fixing chassis body 10 easily without using any securing tool.

Referring to FIGS. 1A, 2 and 3A, the first movable chassis unit 2 has at least one support element 24 downward bent and extended from one lateral wall (such as the second lateral wall 202) of the first movable chassis body 20. In other words, the support element 24 can be integrally extended from one lateral wall of the first movable chassis body 20. In the instant disclosure, a raw support element is one part of the bottom portion of the first movable chassis body 20, and the raw support element can be bent outward from the bottom portion of the first movable chassis body 20 and be approximately parallel to the second lateral wall 202 to form the support element 24. In addition, the support element 24 can selectively contact the inner surface 104 of the fixing chassis body 10 or contact a cushion B on the inner surface 104 of the fixing chassis body 10. In the instant disclosure, the support element 24 contacts the cushion B on the inner surface 104 of the fixing chassis body 10.

Referring to FIGS. 3A and 3B, the second movable chassis unit 3 has at least one second movable chassis body 30, a second movable retaining structure 31 disposed on a first lateral wall 301 of the second movable chassis body 30 and mated with the second fixing retaining structure 12, and a second crossing structure 32 disposed on a second lateral wall 302 of the second movable chassis body 30 and mated with the first crossing structure 22. The first lateral wall 301 and the second lateral wall 302 of the second movable chassis body 30 are respectively disposed on two opposite lateral sides of the second movable chassis body 30, and the second movable chassis body 30 has a second receiving portion 300 formed therein for receiving a second electronic device such as a hard disk drive D2.

For example, the first crossing structure 22 has at least one hooking hole 220 and at least one inserting hole 221, and the second crossing structure 32 has at least one hooking element 320 hooked in the hooking hole 220 and at least one inserting element 321 inserted into the inserting hole 221, and the size of the hooking element 320 corresponds to the size of the hooking hole 220. In addition, the second fixing retaining structure 12 has at least one second protrusion portion 120 (the second protrusion portion 120 can also be a retaining hole with any shape), and the second movable retaining structure 31 has at least one second elastic piece 310 selectively moved to close to or far from the second protrusion portion 120 and at least one second retaining element 311 disposed on the second elastic piece 310 and selectively inserted into or separated from the second protrusion portion 120.

Referring to FIGS. 3A and 3B, in the instant disclosure, the first crossing structure 22 has two hooking holes 220 and two inserting holes 221, the second crossing structure 32 has two hooking elements 320 and two inserting element 321, and each hooking element 320 has an arc-shaped surface. In addition, the second fixing retaining structure 12 has two second protrusion portions 120, and the second movable retaining structure 31 has two second elastic pieces 310 and two second retaining elements 311.

Figure 4A:
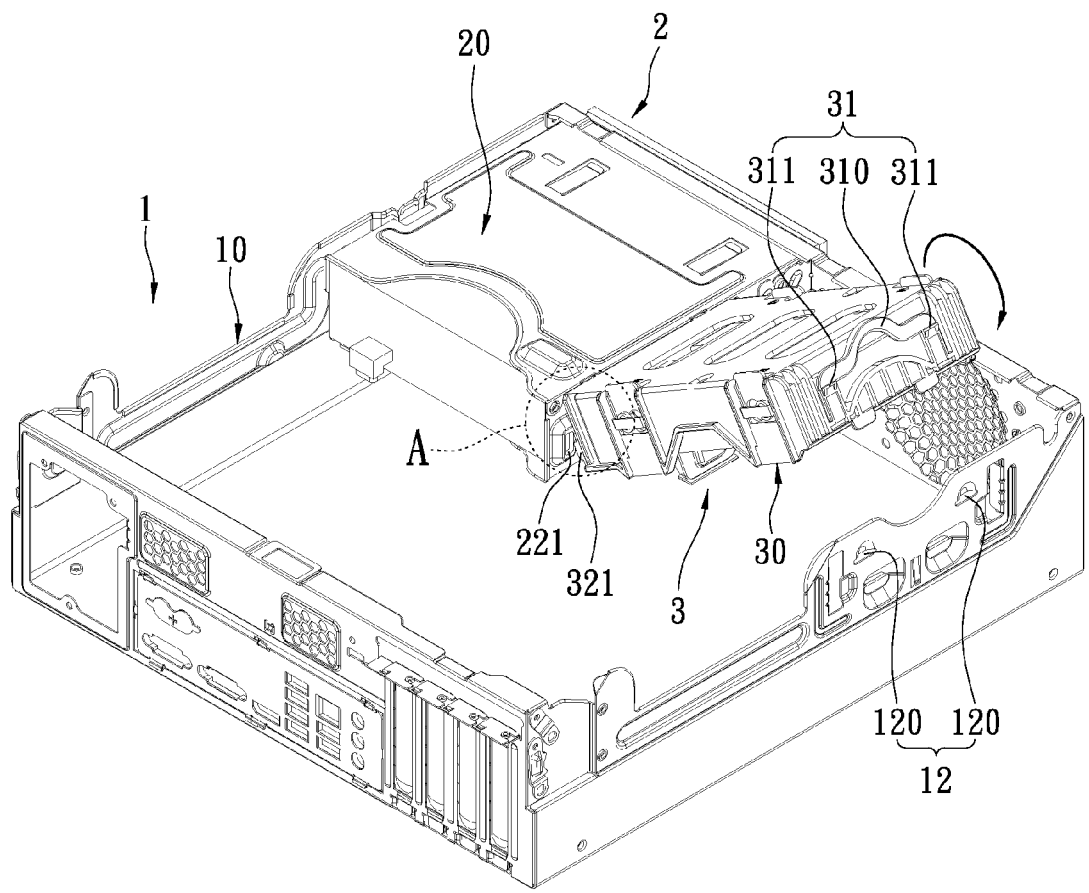
FIG. 4A shows a perspective, exploded, schematic view of the chassis module (after assembling the first movable chassis unit and one part of the second movable chassis unit in the fixing chassis unit) according to the instant disclosure.
Figure 4B:
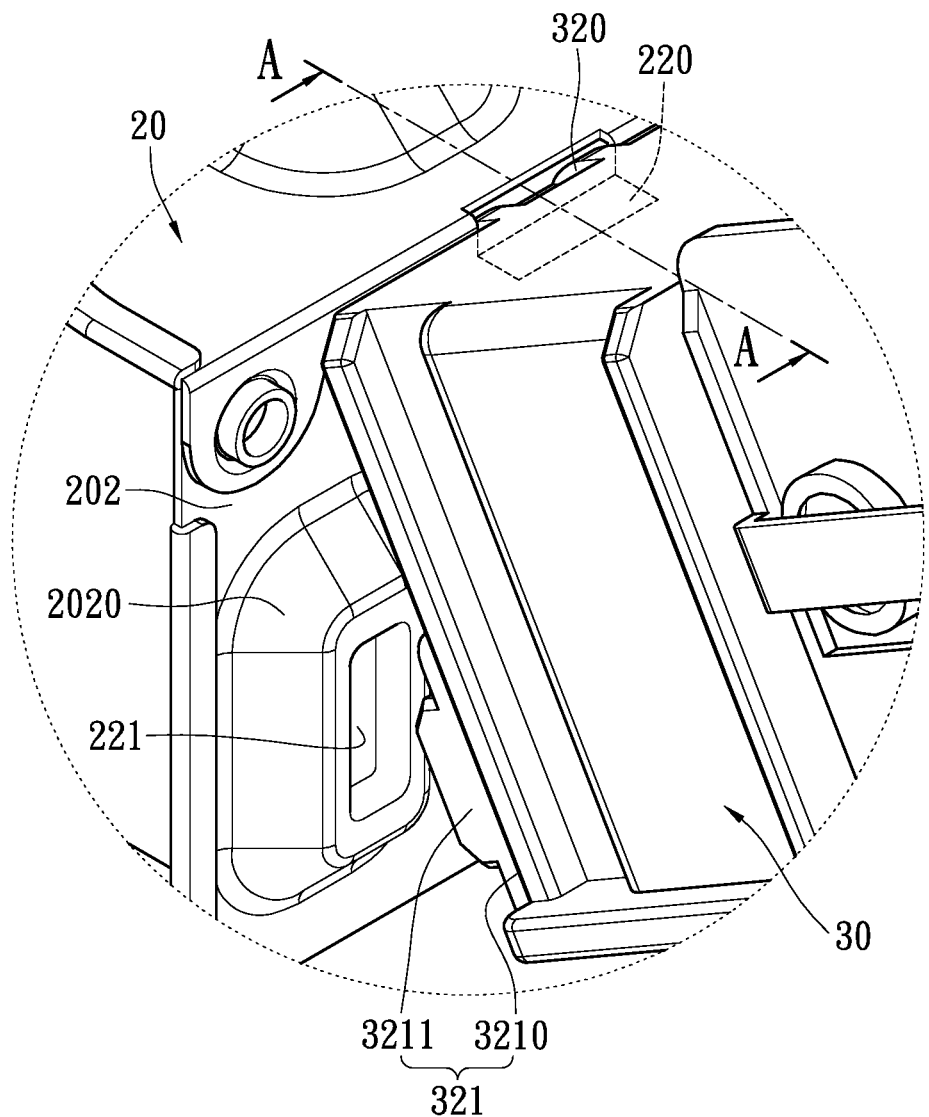
FIG. 4B is an enlarged view of A part of FIG. 4A.
Figure 4C:
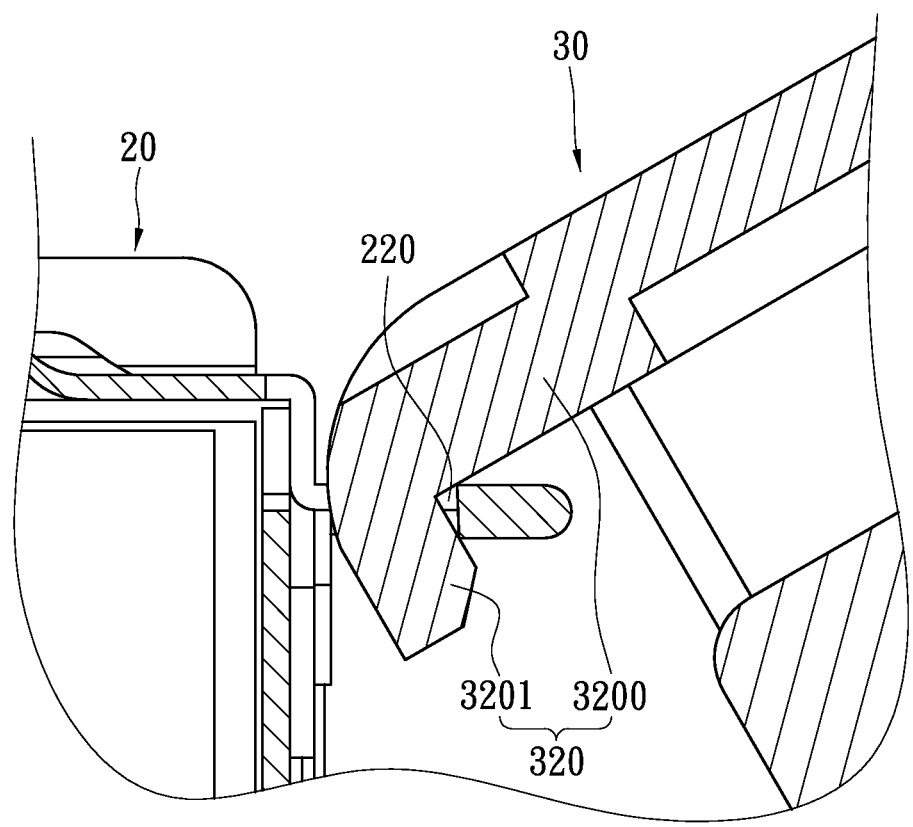
FIG. 4C is a cross-sectional view along line A-A shown in FIG. 4A.

Referring to FIGS. 3A and 4A-4C, the two hooking elements 320 of the second movable chassis body 30 are respectively hooked into the two hooking holes 220 of the first crossing structure 22 firstly (as shown in FIGS. 4B and 4C), and then the second movable chassis body 30 can be rotated and pressed to the end relative to the two hooking holes 220 (shown as the arrow in FIG. 4A). In addition, each hooking element 320 has an extending portion 3200 extended outward from the second movable chassis body 30 and a bending portion 3201 bent downward from the extending portion 3200 and passing through each hooking hole 220, and the size of each bending portion 3201 corresponds to each hooking hole 220. The bending portion 3201 of each hooking element 320 has an arc-shaped surface selectively contacting an inner surface of each hooking hole 220. Because the arc-shaped surface of each bending portion 3201 contacts the inner surface of each hooking hole 220, thus each hooking element 320 can smoothly and conveniently pass through each hooking hole 220 (as shown in FIG. 4C). Moreover, one part of the size of each inserting element 321 corresponds to the size of each inserting hole 221. Each inserting element 321 has a stopping portion 3210 extended outward from the second movable chassis body 30 and an inserting portion 3211 extended outward from the stopping portion 3210 and inserted into each inserting hole 221 (as shown in FIG. 4B). The first movable chassis body 20 has two convex portions 2020 extended outward from the second lateral wall 202 thereof, and each convex portion 2020 as shown in FIG. 4B is formed around each inserting hole 221. The inserting portion 3211 of each inserting element 321 is received inside each convex portion 2020 to prevent the optical disk drive D1 from being interferedly contacted by the inserting portion 3211 of each inserting element 321.

Furthermore, the first movable chassis body 20 and the second movable chassis body 30 can be separated from each other by a predetermined gap due to the design of the convex portions 2020. In other words, the second lateral wall 202 of the first movable chassis body 20 does not completely contact the second lateral wall 302 of the second movable chassis body 30, thus the heat-dissipating efficiency of the first movable chassis body 20 and the second movable chassis body 30 is increased. For example, wind generated by a system fan (not shown) installed in the fixing chassis body 10 can pass through the gap between the first movable chassis body 20 and the second movable chassis body 30 to increase the heat-dissipating efficiency for the first movable chassis body 20 and the second movable chassis body 30.

Figure 5A:
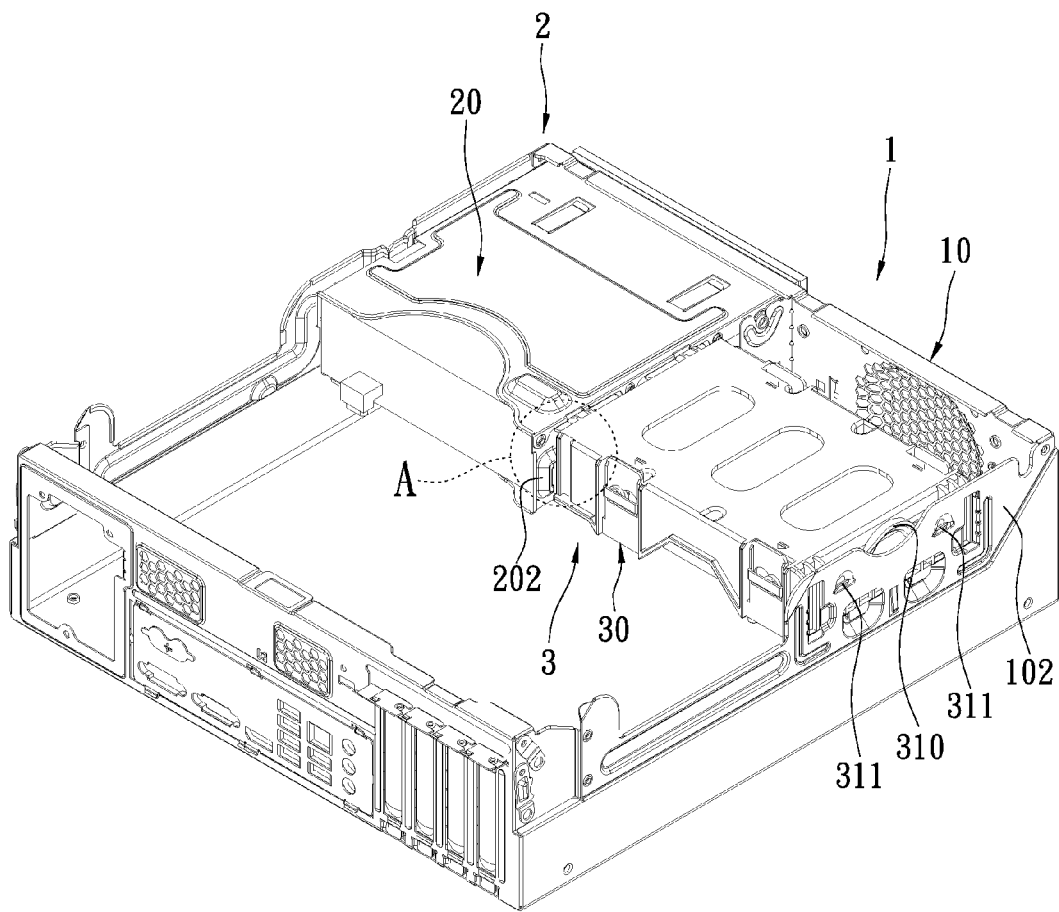
FIG. 5A shows a perspective, exploded, schematic view of the chassis module (after assembling the first movable chassis unit and the second movable chassis unit in the fixing chassis unit) according to the instant disclosure.
Figure 5B:
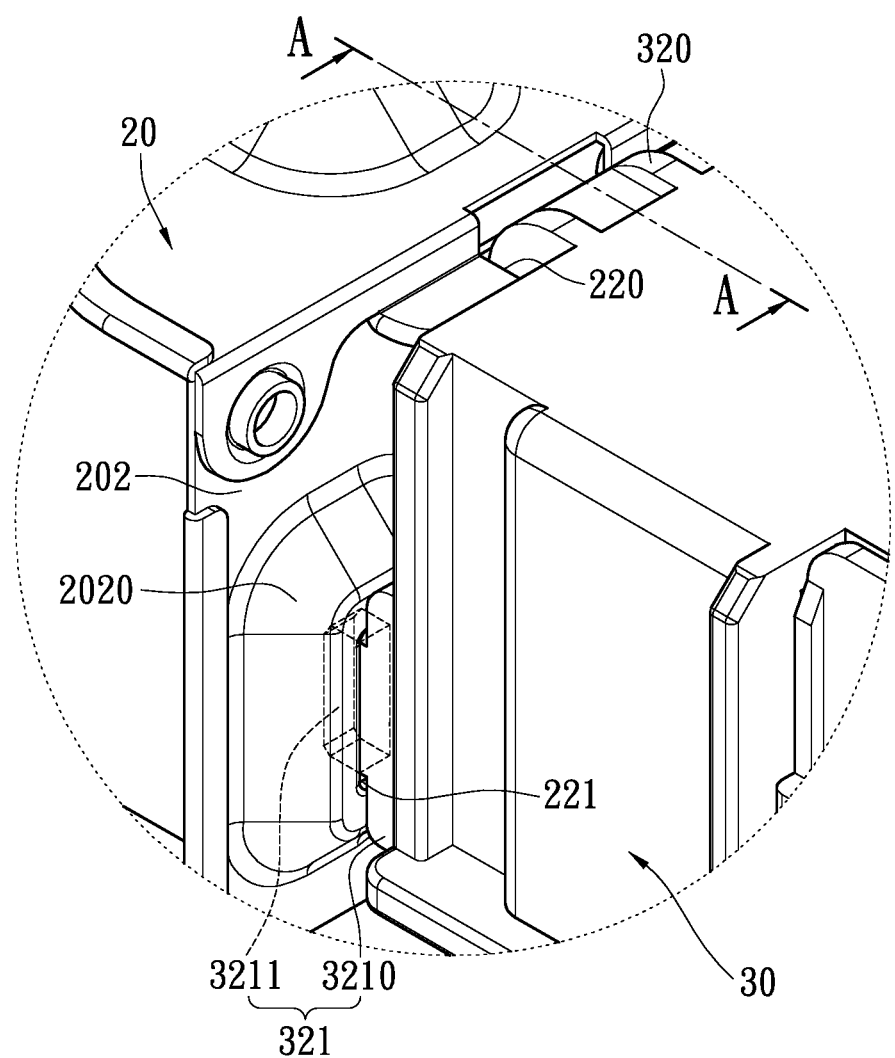
FIG. 5B is an enlarged view of A part of FIG. 5A.
Figure 5C:
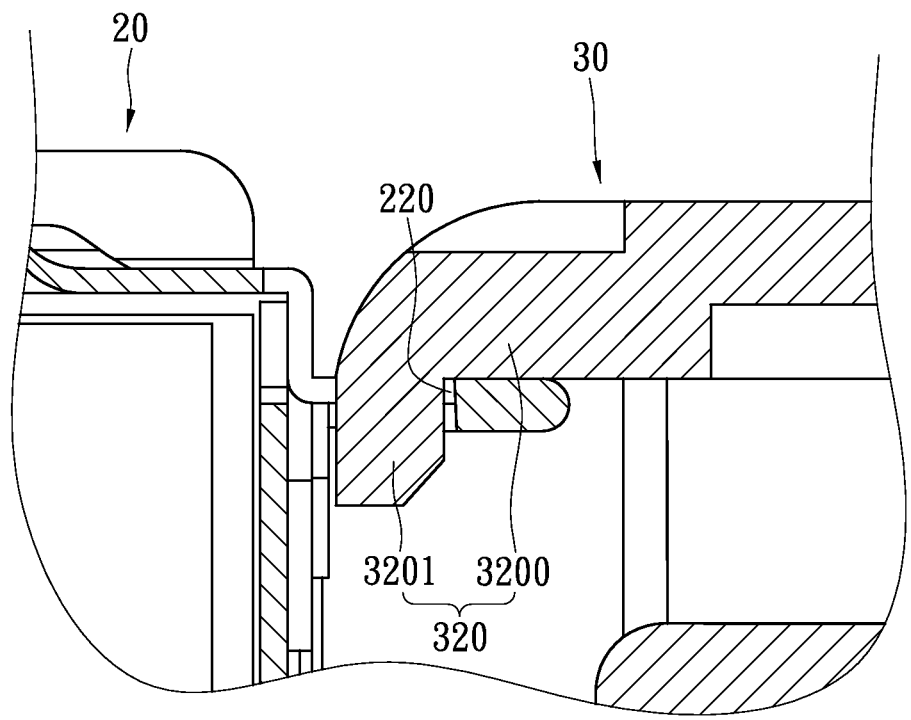
FIG. 5C is a cross-sectional view along line A-A shown in FIG. 5A.

Referring to FIGS. 5A to 5C, when the second movable chassis body 30 is pressed downward and rotated to the end, the two inserting elements 321 of the second crossing structure 32 are respectively and smoothly inserted into the two inserting holes 221 of the first crossing structure 22 (as shown in FIG. 5B). At the same time, the second elastic piece 310 is pushed to close to the two second protrusion portion 120 by its stored elastic force, thus the two second retaining element 311 can be respectively and smoothly inserted into the two second protrusion portion 120 for positioning the second movably chassis body 30 in the fixing chassis body 10 (as shown in FIG. 5A).

In other words, first, the bending portion 3201 of each hooking element 320 of the second movable chassis body 30 can be hooked into each hooking hole 220 of the first crossing structure 22, and then the second movable chassis body 30 can be pressed downward and rotated to the end relative to the two hooking holes 220, thus the inserting portion 3211 of each inserting element 321 can be smoothly inserted into each inserting hole 221 of the first crossing structure 22 and be surroundingly covered by each convex portion 2020. At the same time, the stopping portion 3210 of each inserting element 321 can be obstructed out of the each convex portion 2020.

According to the above-mentioned assembly method, the second movable chassis body 30 can be assembled in the fixing chassis body 10, and the second movable chassis body 30 can also be positioned between the second lateral wall 202 of the first movable chassis body 20 and the second lateral wall 102 of the fixing chassis body 10 (as shown in FIG. 5A).

In addition, the second movable chassis body 30 fixed in the fixing chassis body 10 can be approximately parallel to the inner surface 104 of the fixing chassis body 10 and approximately parallel to the first movable chassis unit 2 due to the designs of the first crossing structure 22 and the second fixing retaining structure 12. Moreover, the positions of the first fixing retaining structure 11, the first crossing structure 22 and the second fixing retaining structure 12, the first fixing retaining structure 11 need to be design carefully for prevent the heights of the first movable chassis unit 2 or the second movable chassis unit 3 from being protruded over the top fringes of the first lateral wall 101, the second lateral wall 102 and the third lateral wall 103. Hence, when a cover (not shown) covers an opening of the fixing chassis unit 1 (the opening is surrounded by the first lateral wall 101, the second lateral wall 102 and the third lateral wall 103), the bottom side of the cover can not touch the first movable chassis unit 2 and the second movable chassis unit 3.

Furthermore, when the user wants to take the second movable chassis body 30 out from the fixing chassis body 10, the user can lightly touch (pushing action) a top portion of the second elastic piece 310 toward the second movable chassis body 30 for respectively separating the two second retaining elements 311 from the two second protrusion portions 120, thus it is easy for the user to take the second movable chassis body 30 out from the fixing chassis body 10 by lightly touching the second elastic piece 310. Hence, the second movable chassis unit 3 can be detachably disposed in the fixing chassis body 10 according to different requirements. In other words, the user can assemble the second movable chassis unit 3 in the fixing chassis body 10 or detach the second movable chassis unit 3 from the fixing chassis body 10 easily without using any securing tool.

In conclusion, one lateral wall of the first movable chassis body 20 and one lateral wall of the fixing chassis body 10 can be retainedly mated with each other, one lateral wall of the second movable chassis body 30 and another later wall of the first movable chassis body 20 can be retainedly mated with each other, and another lateral wall of the second movable chassis body 30 and another lateral wall of the fixing chassis body 10 can be retainedly mated with each other. In other words, one lateral wall of the first movable chassis body 20 and one lateral wall of the second movable chassis body 30 are respectively retainedly mated with the two opposite lateral walls of the fixing chassis body 10, and another lateral wall of the first movable chassis body 20 and another lateral wall of the second movable chassis body 30 are crossly and retainedly mated with each other. Hence, the first movable chassis unit 2 and the second movable chassis unit 3 can be assembled in or detached from the fixing chassis unit 1 easily according to the above-mentioned simple structure design.

In other words, because the first movable retaining structure 21 can be selectively mated with the first fixing retaining structure 11 and the second movable retaining structure 31 can be selectively mated with the second fixing retaining structure 12, the first movable chassis unit 2 and the second movable chassis unit 3 can be assembled in the fixing chassis unit 1 easily. In addition, the first movable chassis unit 2 and the second movable chassis unit 3 can also be detached from the fixing chassis unit 1 easily by the above-mentioned pushing action.

The above-mentioned descriptions merely represent the preferred embodiments of the instant disclosure, without any intention or ability to limit the scope of the instant disclosure which is fully described only within the following claims. Various equivalent changes, alterations or modifications based on the claims of instant disclosure are all, consequently, viewed as being embraced by the scope of the instant disclosure.

What is claimed is:

1. A chassis module for fixing electronic devices, comprising:
    a fixing chassis unit having a fixing chassis body, a first fixing retaining structure disposed on a first lateral wall of the fixing chassis body, and a second fixing retaining structure disposed on a second lateral wall of the fixing chassis body;
    a first movable chassis unit detachably disposed in the fixing chassis body, wherein the first movable chassis unit has at least one first movable chassis body, a first movable retaining structure disposed on a first lateral wall of the at least one first movable chassis body and mated with the first fixing retaining structure, and a first crossing structure disposed on a second lateral wall of the at least one first movable chassis body, and the first crossing structure has at least one hooking hole and at least one inserting hole; and
    a second movable chassis unit detachably disposed in the fixing chassis body, wherein the second movable chassis unit has at least one second movable chassis body, a second movable retaining structure disposed on a first lateral wall of the at least one second movable chassis body and mated with the second fixing retaining structure, and a second crossing structure disposed on a second lateral wall of the at least one second movable chassis body and mated with the first crossing structure, wherein the second crossing structure has at least one hooking element and at least one inserting element, the size of the at least one hooking element corresponds to the size of the at least one hooking hole, and one part of the size of the at least one inserting element corresponds to the size of the at least one inserting hole;
    wherein the at least one hooking element has an extending portion extended outward from the at least one second movable chassis body and a bending portion bent downward from the extending portion, the size of the bending portion corresponds to the at least one hooking hole, and the at least one inserting element has a stopping portion extended outward from the at least one second movable chassis body and an inserting portion extended outward from the stopping portion and inserted into the at least one inserting hole.

2. The chassis module of claim 1, wherein the fixing chassis unit has at least two first pivot portions inwardly bent and extended from a third lateral wall of the fixing chassis body, the first movable chassis unit has at least two second pivot portions respectively mated with the at least two first pivot portions, and the third lateral wall is connected between the first lateral wall and the second lateral wall.

3. The chassis module of claim 2, wherein each first pivot portion has a pivot groove or a pivot post, and each second pivot portion has a pivot post received in the pivot groove of each first pivot portion or a pivot groove for receiving the pivot post of each first pivot portion.

4. The chassis module of claim 1, wherein the first fixing retaining structure has at least one positioning hole and at least one first protrusion portion, and the first movable retaining structure has at least one positioning element inserted into the at least one positioning hole, at least one first elastic piece selectively moved to close to or far from the at least one first protrusion portion, and at least one first retaining element disposed on the at least one first elastic piece and selectively inserted into or separated from the at least one first protrusion portion.

5. The chassis module of claim 1, wherein the bending portion of the at least one hooking element has an arc-shaped surface selectively contacting an inner surface of the at least one hooking hole.

6. The chassis module of claim 1, wherein the at least one first movable chassis body has a convex portion extended outward from the second lateral wall thereof and formed around the at least one inserting hole.

7. The chassis module of claim 1, wherein the second fixing retaining structure has at least one second protrusion portion, and the second movable retaining structure has at least one second elastic piece selectively moved to close to or far from the at least one second protrusion portion and at least one second retaining element disposed on the at least one second elastic piece and selectively inserted into or separated from the at least one second protrusion portion.

8. The chassis module of claim 1, wherein the first movable chassis unit has at least one support element downward bent and extended from one lateral wall of the at least one first movable chassis body.

9. The chassis module of claim 1, wherein the at least one first movable chassis body has a first receiving portion formed therein for receiving a first electronic device, and the at least one second movable chassis body has a second receiving portion formed therein for receiving a second electronic device.

* * * * *